US 6,636,571 B1

(12) United States Patent
Kinjo

(10) Patent No.: US 6,636,571 B1
(45) Date of Patent: Oct. 21, 2003

(54) AUTOMATIC FREQUENCY CONTROL SYSTEM WITH IMPROVED ARGUMENT APPROXIMATION

(75) Inventor: Shigenori Kinjo, Ibaraki (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/467,402

(22) Filed: Dec. 20, 1999

(51) Int. Cl.$^7$ .............................................. H04L 27/06
(52) U.S. Cl. ....................................................... 375/344
(58) Field of Search ................................. 375/326, 327, 375/339, 344; 455/136, 139, 173.1, 182.2, 192.2, 196.1; 327/3, 40; 329/302, 323, 325

(56) References Cited

U.S. PATENT DOCUMENTS

| | | | | |
|---|---|---|---|---|
| 5,550,596 A | * | 8/1996 | Strolle et al. ................ | 348/607 |
| 5,732,111 A | * | 3/1998 | Walley ......................... | 375/344 |
| 5,832,043 A | * | 11/1998 | Eory ............................ | 375/344 |
| 6,298,100 B1 | * | 10/2001 | Bouillet ....................... | 375/326 |
| 6,463,266 B1 | * | 10/2002 | Shohara .................... | 455/196.1 |

OTHER PUBLICATIONS

"Wideband Wireless Access Based on DS–CDMA," IEICE Trans. Commun., vol. E81–B, No. 7, Jul. 1998, pp. 1305–1317 (Fumiyuki Adachi; Mamoru Sawahashi).

"A Coherent Spread–Spectrum Diversity–Receiver With AFC for Multipath Fading Channels," IEEE Transactions on Communications, vol. 42, No. 2/3/4, Feb./Mar./Arp. 1994, pp. 1300–1311 (Urs Fawer).

"Japan's Proposal for Candidate Radio Transmission Technology on IMT–2000: W–CDMA," RTT, Jun. 1998.

"The ETSI UMTS Terrestrial Radio Access (ULTRA) ITU–R RTT Candidate Submission," Jun. 1998, ETSI SMG2.

"Considerations on the Pilot Symbol–Assisted AFC for the Wideband DS–CDMA System," Proceedings of the 1998 IEICE General Conference, B–5–109, p. 473 (Mar. 1998).

"Performance of AFC Scheme Based on Half–Symbol Differential Detection," IEICE Tech. Rep. RSC96–25 pp. 1–6 (Jun. 1996).

"A Study on Automatic Frequency Control for Spread Spectrum Mobile Radio Communication," IEICE Tech. Rep. RSC96–105, pp. 45–50 (Nov. 1996).

* cited by examiner

Primary Examiner—Emmanuel Bayard
(74) Attorney, Agent, or Firm—Frederick J. Telecky, Jr.; W. James Brady, III

(57) ABSTRACT

An argument approximation method is used to estimate the frequency offset for an automatic frequency control (AFC) circuit. An angle of rotation can be calculated as arctan(Q/I), where Q is the imaginary component of the rotation and I is the real component of the angle. Rather than use the arctangent calculation, which is resource intensive, to calculate the angle of rotation, the angle of rotation is calculated as the sine of the angle of rotation, which is easily calculated from Q and I, and the sine approximation is offset by a correction factor of 1−cos (θ) in order to reduce approximation errors.

9 Claims, 3 Drawing Sheets

Sinusoid Estimation — Error Compensation

AFC Computation 16

$T_{sl}$ : Slot period (0.625ms)

AUTOMATIC FREQUENCY CONTROL SYSTEM WITH IMPROVED ARGUMENT APPROXIMATION

CROSS-REFERENCE TO RELATED APPLICATIONS

Not Applicable

STATEMENT OF FEDERALLY SPONSORED RESEARCH OR DEVELOPMENT

Not Applicable

BACKGROUND OF THE INVENTION

1. Technical Field

This invention relates in general to communications and, more particularly, to automatic frequency control systems.

2. Description of the Related Art

Automatic frequency control (AFC) systems are important parts of radio communication systems, such as the wide-band CDMA (Code Division Multiple Access) systems. An AFC system reduces small inconsistencies between the carrier frequency of a transmitter and the carrier frequency of a receiver. The inconsistency is referred to as "frequency offset." If the carrier frequency offset is large, demodulated signals at a receiver will include frequency rotation, which leads to the increase of the bit error rate.

The carrier frequency offset can be improved through the use of an AFC system. The typical AFC system performs two steps: (1) it estimates the carrier frequency offset from the demodulated signals, and (2) based on the estimated frequency offset, a voltage controlled oscillator (VCO) is controlled so as to reduce the carrier frequency offset.

Many research interests have been concerned with the first step, and many efforts have improved the accuracy of the carrier frequency estimation and convergence speed of the AFC. These improvements are discussed in: Urs Fawer, *a Coherent Spread-Spectrum Diversity-Receiver with AFC for Multipath Fading Channels,* IEEE Transactions on Communications, Vol. 42, No. 2/3/4, pp 1300–1311 (February 1994) and Kazuo Tanada, Fumio Ishizu, Keishi Murahami and Tadashi Fujino, *performance of AFC Scheme Based on Half-Symbol Differential Detection,*" IEICE Tech.Rep.RSC96-25, pp 1–6 (June 1996). However, as a final step of frequency offset estimation, these methods include an arctangent calculation. Using arctangent results in the increase of the computational complexity of digital signal processing systems. On the other hand, Hideki Ishizuki and Shinichi Sato, *A Study on Automatic Frequency Control for Spread Spectrum Mobile Radio Communication,* IEICE Tech.Rep.RSC96-105, pp.45–50 (November 1996), presents a method which approximately estimates the frequency offset and proposes to apply random walk to improve the convergence of the AFC. This method uses the Doppler frequency to stabilize the system, which is also difficult to implement.

Therefore, a need has arisen for an AFC system with a simple calculation for offset frequency.

BRIEF SUMMARY OF THE INVENTION

In the present invention, frequency of an oscillator is controlled by determining real and imaginary components of an angle of rotation between a carrier frequency and output of the controllable oscillator and generating a sinusoidal approximation of the angle of rotation from said real and imaginary components and an offset to the sinusoidal approximation responsive to the sign of the sinusoidal approximation to produce an enhanced approximation. The oscillator is adjusted responsive to the enhanced approximation.

The present invention provides significant advantages over the prior art. The approximation of the angle of rotation makes it possible to extend the pull-in range of the AFC greater than that of conventional approximation techniques and improves the convergence speed of the AFC system when initial carrier frequency offset is large, while maintaining a simple approximation approach.

BRIEF DESCRIPTION OF THE SEVERAL VIEWS OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The present invention is best understood in relation to FIGS. 1–6 of the drawings, like numerals being used for like elements of the various drawings.

Figure 1:
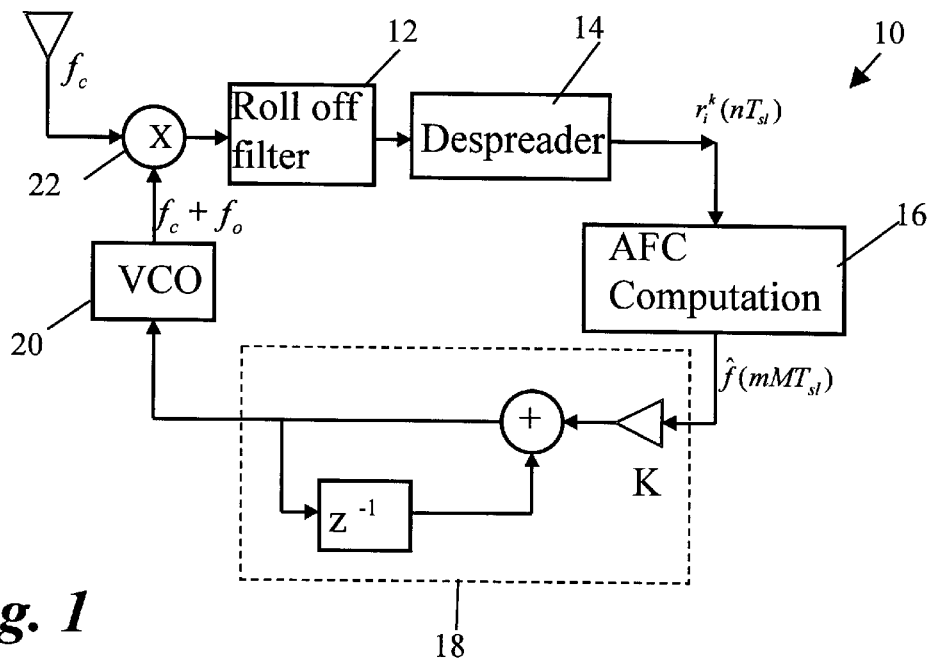
FIG. 1 illustrates a block diagram of an AFC circuit.

FIG. 1 illustrates a block diagram showing the application of an AFC system to a receiver 10 in a Wide-band CDMA system. A signal is received at a predetermined carrier frequency, $f_c$. A roll off filter 12 is applied to the signal. A despreader 14 finds the dominant finger (the kth finger) and outputs the individual pilot symbols $r_i^k(nT_{sl})$, where n is the slot index and $T_{sl}$ is the slot period.

Using the pilot symbols, the AFC calculation circuitry 16 is applied to estimate the carrier frequency offset. Integrator 18 integrates the estimated frequency offset. The output of integrator 18 supplies a voltage to control the VCO (voltage controlled oscillator) 20. Mixer 22 receives the sum of the offset frequency and the carrier frequency, $f_o+f_c$, from the VCO 20, subtracts the carrier frequency, $f_c$, and outputs the resultant offset frequency, $f_o$, to the roll-off filter 12.

In operation, the signal from the AFC calculation circuitry varies the signal to the VCO 20 depending upon the offset frequency, such that $f_o$ is driven to zero. At that point, the output of the VCO is locked to the carrier frequency. This circuit can be used in any application where a device must generate a clock signal that is locked to a carrier frequency, such as in many communication devices, such as cellular phones and other mobile telecommunications devices.

Figure 2:
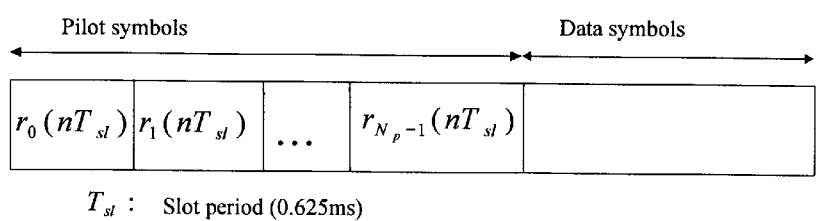
FIG. 2 illustrates a frame structure.

A frame structure for the signal is shown in FIG. 2. The signal includes Np pilot symbols. The carrier frequency offset calculation is generated by the AFC calculation circuitry using the pilot symbols.

The initial acquisition of the AFC is carried out for the Perch channel of a Wide-band CDMA system. The carrier frequency offset can be estimated using the following equation using Np pilot symbols inserted into the radio frame shown in FIG. 2:

$$\hat{f}(mMT_{sl}) = \frac{1}{2\pi T_s}\arg\left\{\sum_{j=0}^{M-1}\sum_{i=0}^{N_p-2} r_i^*((mM-j)T_{sl})r_{i+1}((mM-j)T_{sl})\right\}$$

where: * denotes the complex conjugate;
m is the number of AFC updates (1, 2, 3, ... ,); and
M is the average length of the slots.

Parameters for a W-CDMA implementation are provided in Table 1.

TABLE 1

Parameters for the initial acquisition mode

| Pilot symbols Np | Slot period Tsl | Symbol period Ts | Required pull-in range |
|---|---|---|---|
| 4 | 0.625 ms | 0.0625 ms | $\|3\pi/4\|(\|6000\ Hz\|)$ |

The range of estimated frequency offset can be determined by deriving the argument in equation (1), for example, between $\pi$ and $-\pi$ as:

$$\hat{f}(-\pi) = \hat{f}_{min} = \frac{1}{2\pi T_s}(-\pi) = -8000\ Hz$$

$$\hat{f}(\pi) = \hat{f}_{max} = \frac{1}{2\pi T_s}(-\pi) = 8000\ Hz$$

According to Wide-band CDMA system requirements, the AFC must reduce the carrier frequency offset from 3 ppm to 0.1 ppm. 3 ppm for 2 GHz corresponds to the offset frequency of 6000 Hz. Using the parameters in Table 1, the range of the argument is from $+3\pi/4$ to $-3\pi/4$.

Defining:

$$I = \text{Re}\left[\sum_{j=0}^{M-1}\sum_{i=0}^{N_p-2} r_i^*((mM-j)T_{sl})r_{i+1}((mM-j)T_{sl})\right]$$

and $$Q = \text{Im}\left[\sum_{j=0}^{M-1}\sum_{i=0}^{N_p-2} r_i^*((mM-j)T_{sl})r_{i+1}((mM-j)T_{sl})\right],$$

then Equation (1) can be rewritten as $$\hat{f}(mMT_{sl}) = \frac{1}{2\pi T_s}\arctan\left(\frac{Q}{I}\right). \quad \text{(Method 1)}$$

Figure 3:
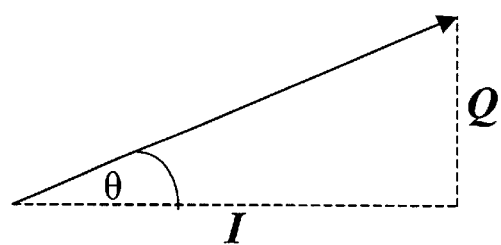
FIG. 3 illustrates a diagram of the rotation components.

This is illustrated in FIG. 3, where $$\theta = \arg\left\{\sum_{j=0}^{M-1}\sum_{i=0}^{N_p-2} r_i^*((mM-j)T_{sl})r_{i+1}((mM-j)T_{sl})\right\} = \text{angle of rotation}.$$

Method 1 uses an arctangent calculation, which is undesirable because of its large computational load. Accordingly, in the prior art, it has been proposed that Equation (1) be approximated by using the sinusoid, $$\hat{f}(mMT_{sl}) = \frac{1}{2\pi T_s}\left(\frac{Q}{\sqrt{Q^2+I^2}}\right). \quad \text{(Method 2)}$$

Although Method 2 is interesting for its simple calculation, the accuracy of the estimation is degraded for arguments greater than $|\pi/2|$. Accordingly, this method of estimation results in degradation of the AFC when the initial frequency offset is greater than 4000 Hz.

In order to improve the pull-in range of Method 2, the present invention compensates for the degradation in the approximation, without substantially increasing the computational load.

Figure 4:
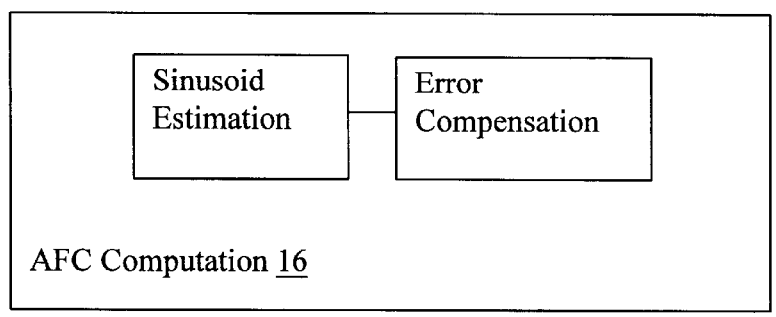
FIG. 4 illustrates a block diagram of the AFC computational circuit.

FIG. 4 illustrates a block diagram of the AFC Computation circuit. In this circuit, the sinusoid calculation of Method 2 is used as a first approximation, and a compensation calculation is used to reduce errors in the areas of highest degradation.

In a preferred embodiment of the invention, the following definitions are made:

$$Q' = \frac{Q}{\sqrt{Q^2+I^2}}$$

$$I' = \frac{I}{\sqrt{Q^2+I^2}}$$

Using these definitions, a new estimation can be established by the following equation:

$$\hat{f}(mMT_{sl}) = \frac{1}{2\pi T_s}\{sgn(Q')x[1-I'] + Q'\}$$

where the function sgn(A) means to take the sign of A (i.e., if A is positive, sgn(A)=1, if A is negative, sgn(A)=−1.

In essence, if sin ($\theta$) is positive, 1−cos ($\theta$) is added to the approximation. If sin ($\theta$) is negative, 1−cos ($\theta$) is subtracted from the approximation. Since 1−cos ($\theta$) is approximately equal to zero for small angles, it does not adversely affect the accuracy of the estimation in the region of $$-\frac{\pi}{2} < \theta < \frac{\pi}{2}.$$

For $$-\pi < \theta < -\frac{\pi}{2}\ \text{and}\ \frac{\pi}{2} > \theta > \pi,$$

the compensation significantly increases the accuracy of the estimation. The additional calculations for the compensation adds very little overhead to the overall calculation.

Figure 5:
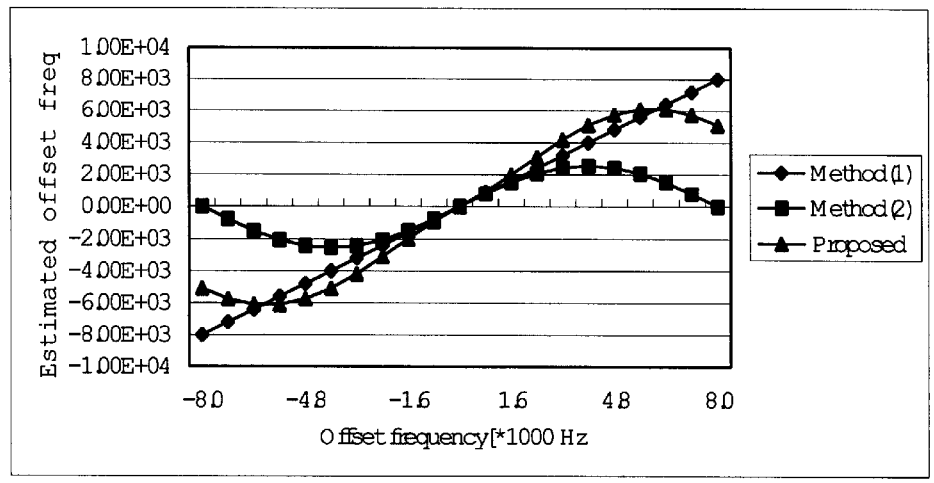
FIG. 5 illustrates a diagram of the proposed argument approximation compared with a previous estimation method.

FIG. 5 illustrates a diagram showing the effect of the compensation on the estimation. Method 1 is the exact calculation of the offset frequency based on the arctangent. Method 2 is the sinusoidal approximation of the arctangent. As can be seen clearly from FIG. 5, the Proposed calculation using 1−cos ($\theta$) as the compensation factor greatly reduces the error towards the extremities of the frequency range, extending the pull-in range to ±8000 Hz.

Figure 6:
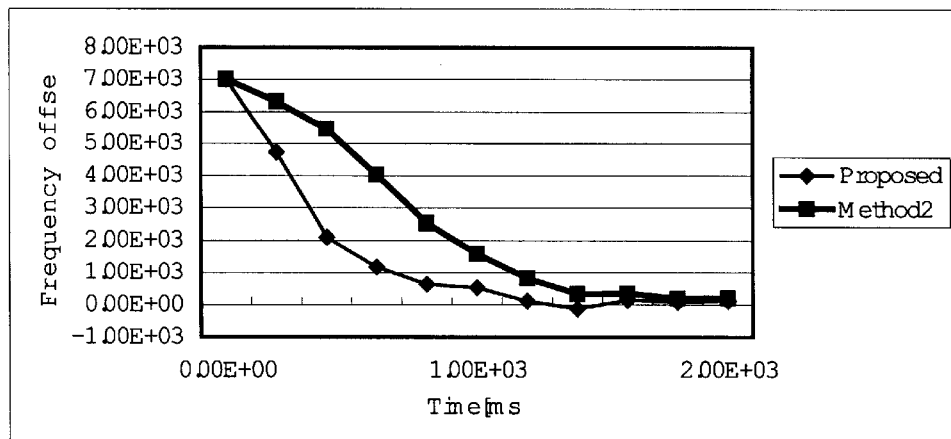
FIG. 6 illustrates a diagram of the pull-in performance using the proposed argument approximation compared with the previous estimation method.

FIG. 6 illustrates a computer simulation of the performance of the AFC computation circuitry 16 as compared with computation circuitry for deriving the equation of Method 2. Table 2 sets forth the conditions of the simulation.

TABLE 2

Conditions for the computer simulation.

| Channel condition | AWGN |
|---|---|
| Physical channel of W-CDMA system | Perch channel |
| # of pilot symbols (Np) | 4 |
| Average length (M) | 64 |
| Frequency compensation period | 40 ms |
| Initial offset frequency | 7 kHz |
| Step size parameter (K) | 0.0125 |

As can be seen in FIG. 6, the convergence speed of the pull-in performance using the AFC computation circuitry 16 is greatly enhanced. The standard deviation and pull-in time for different signal-to-noise ratios (SNRs) is shown in Table 3.

TABLE 3

The standard deviation and the pull-in time

| SNR [dB] | Standard deviation | | Pull-in time [ms] | |
|---|---|---|---|---|
| | −5 | 0 | −5 | 0 |
| Method2 | 173 Hz | 86.6 Hz | 1800 ms | 1680 ms |
| Proposed method | 159 Hz | 65.1 Hz | 1200 ms | 1080 ms |

\* SNR denotes the signal to noise ratio of de-spread signals.
\* Pull-in time is the time within which the AFC reduces the frequency offset within 200 Hz.

The AFC calculation can be performed either by a DSP (digital signal processor) or other programmable processing device, or by a wired logic circuit. In cases where a wired logic circuit is used, the proposed method significantly increases the accuracy over Method 2, while using only a minimal amount of additional circuitry. Using Method 1 with wired circuitry is generally impractical. If the AFC calculation is implemented in a DSP or other programmable processor, Method 1 is sometimes used, however, additional calculations or look-up tables are required for the arctangent calculation; therefore, the proposed method with is simpler structure provides benefits for processor based implementations as well.

The present invention provides significant advantages over the prior art. The approximation of the offset frequency argument makes it possible to extend the pull-in range of the AFC greater than that of conventional approximation techniques and improves the convergence speed of the AFC system when initial carrier frequency offset is large. Simulation results show that the proposed method improves the pull-in performance of the AFC.

Although the Detailed Description of the invention has been directed to certain exemplary embodiments, various modifications of these embodiments, as well as alternative embodiments, will be suggested to those skilled in the art. The invention encompasses any modifications or alternative embodiments that fall within the scope of the claims.

What is claimed is:

1. An automatic frequency control circuit comprising:

a controllable oscillator for generating a signal having a frequency responsive to an input;

circuitry for comparing the output of the controllable oscillator to a carrier frequency;

circuitry for adjusting said input to said controllable oscillator, said adjusting circuitry comprising:

circuitry for determining real and imaginary components (I and Q) of an angle of rotation (θ) between said carrier frequency and the frequency output by the controllable oscillator, where θ=arctan(Q/I);

circuitry for generating an approximation of the angle of rotation (θ'), wherein θ'=sin (θ)+(1−cos (θ)) for sin (θ)>0 and θ'=sin (θ)−(1−cos (θ)) for sin (θ)<0.

2. The automatic frequency control circuit of claim 1 wherein said controllable oscillator comprises a voltage controlled oscillator.

3. The automatic frequency control circuit of claim 1 wherein sin (θ) is calculated as $Q/\sqrt{Q^2+I^2}$.

4. The automatic frequency control circuit of claim 3 wherein 1−cos (θ) is calculated as $1-(I/\sqrt{Q^2+I^2})$.

5. The automatic frequency control circuit of claim 1 wherein said adjusting circuitry further comprises circuitry for integrating said input over time.

6. A method of controlling the frequency of a controllable oscillator, comprising the steps of:

determining real and imaginary components (I and Q) of an angle of rotation (θ) between a carrier frequency and output of the controllable oscillator, where θ=arctan(Q/I);

generating an approximation of the angle of rotation (θ'), wherein θ'=sin (θ)+(1−cos (θ)) for sin (θ)>0 and θ'=sin (θ)−(1−cos (θ)) for sin (θ)<0; and adjusting the controllable oscillator responsive to said enhanced approximation.

7. The method of claim 6 wherein said controllable oscillator comprises a voltage controlled oscillator.

8. The method of claim 6 wherein said step of generating the approximation comprises the step of calculating sin (θ) as $Q/\sqrt{Q^2+I^2}$.

9. The method of claim 8 wherein the step of generating the approximation comprises the step of calculating 1−cos (θ) as $1-(I/\sqrt{Q^2+I^2})$.

\* \* \* \* \*